(12) United States Patent
Campbell et al.

(10) Patent No.: US 7,639,499 B1
(45) Date of Patent: Dec. 29, 2009

(54) LIQUID COOLING APPARATUS AND METHOD FOR FACILITATING COOLING OF AN ELECTRONICS SYSTEM

(75) Inventors: Levi A. Campbell, Poughkeepsie, NY (US); Richard C. Chu, Hopewell Junction, NY (US); Martin J. Crippen, Apex, NC (US); Michael J. Ellsworth, Jr., Lagrangeville, NY (US); Madhusudan K. Iyengar, Woodstock, NY (US); Vinod Kamath, Raleigh, NC (US); Jason A. Matteson, Raleigh, NC (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/168,259

(22) Filed: Jul. 7, 2008

(51) Int. Cl.
*H05K 7/20* (2006.01)
(52) U.S. Cl. .................. 361/699; 361/700; 361/725; 165/80.4; 165/104.19; 257/714; 62/259.2
(58) Field of Classification Search ................ 361/688, 361/689, 699–704, 707, 712, 715, 719–727, 361/732, 756, 831; 165/80.3, 80.4, 80.5, 165/104.19, 104.21, 104.22, 104.33, 104.34, 165/185; 257/714, 715, 717–719, 721, 723; 174/15.1, 15.2, 16.1, 16.3, 252; 62/259.2; 454/184
See application file for complete search history.

(56) References Cited

U.S. PATENT DOCUMENTS

| | | | |
|---|---|---|---|
| 5,963,425 A | 10/1999 | Chrysler et al. | |
| 6,536,510 B2* | 3/2003 | Khrustalev et al. | 165/104.33 |
| 6,807,056 B2* | 10/2004 | Kondo et al. | 361/689 |

(Continued)

FOREIGN PATENT DOCUMENTS

DE   10112389 A1 * 10/2002

(Continued)

OTHER PUBLICATIONS

Campbell et al., "Liquid-Based Cooling Apparatus for an Electronics Rack", U.S. Appl. No. 11/763,678, filed Jun. 15, 2007.

(Continued)

*Primary Examiner*—Michael V Datskovskiy
(74) *Attorney, Agent, or Firm*—Geraldine Monteleone, Esq.; Kevin P. Radigan, Esq.; Heslin Rothenberg Farley & Mesiti P.C.

(57) ABSTRACT

Apparatus and method are provided for facilitating liquid cooling one or more components of an electronic subsystem chassis disposed within an electronics rack. The apparatus includes a rack-level coolant manifold assembly and at least one movable chassis-level manifold subassembly. The rack-level coolant manifold assembly includes a rack-level inlet manifold and a rack-level outlet manifold, and each movable chassis-level manifold subassembly includes a chassis-level coolant inlet manifold coupled in fluid communication with the rack-level inlet manifold, and a chassis-level coolant outlet manifold coupled in fluid communication with the rack-level outlet manifold. The chassis-level manifold subassembly is slidably coupled to the electronics rack to facilitate access to one or more removable components of the electronic subsystem chassis. In one embodiment, the electronics subsystem chassis is a multi-blade center system having multiple removable blades, each blade being an electronics subsystem.

20 Claims, 9 Drawing Sheets

U.S. PATENT DOCUMENTS

| | | | |
|---|---|---|---|
| 6,828,675 B2 * | 12/2004 | Memory et al. | 257/714 |
| 7,057,893 B2 * | 6/2006 | Nicolai et al. | 361/699 |
| 7,187,549 B2 * | 3/2007 | Teneketges et al. | 361/699 |
| 7,258,161 B2 * | 8/2007 | Cosley et al. | 165/104.33 |
| 7,380,409 B2 | 6/2008 | Campbell et al. | |
| 7,428,151 B2 * | 9/2008 | Sonnabend et al. | 361/699 |
| 7,466,549 B2 * | 12/2008 | Dorrich et al. | 361/699 |
| 2007/0201210 A1 | 8/2007 | Chow et al. | |

OTHER PUBLICATIONS

Iyengar et al., "Apparatus and Method for Facilitating Cooling of an Electronics System", U.S. Appl. No. 11/957,619, filed Dec. 17, 2007.

Goettert et al., "Heat Exchange System for Blade Server Systems and Method", U.S. Appl. No. 12/038,025, filed Feb. 27, 2008.

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chee, B., "Supermicro Water Cooled Blades", Info World, Geeks in Paradise, (Mar. 5, 2008), http://weblog.infoworld.com/geeks/archives/2008/03.

* cited by examiner

LIQUID COOLING APPARATUS AND METHOD FOR FACILITATING COOLING OF AN ELECTRONICS SYSTEM

TECHNICAL FIELD

The present invention relates to apparatuses and methods for facilitating cooling of an electronics system, such as a multi-blade center system, and more particularly, to apparatuses and methods for facilitating liquid-cooling of selected electronic components of an electronics system without impacting serviceability of the electronics system.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many server applications, processors along with their associated electronics (e.g., memory, disc drives, power supplies, etc.) are packaged in removable drawer or blade configurations disposed within a housing. Typically, the components are cooled by air moving in parallel air flow paths, usually front-to-back, impelled by one or more air-moving devices (e.g., fans or blowers). In some cases, it may be possible to handle increased power dissipation within a single drawer or blade chassis by providing greater air flow, through the use of a more powerful air-moving device, or by increasing the rotational speed (i.e., RPMs) of an existing air-moving device. However, this approach is becoming problematic at the system level.

The sensible heat load carried by air exiting the electronics rack is stressing the ability of room air-conditioning to effectively handle the load. This is especially true for large installations with "server farms" or large banks of computer racks close together. In such installations, liquid cooling of selected components is an attractive technology to manage the higher heat fluxes. The liquid coolant absorbs the heat dissipated by selected components/modules in an efficient manner. Typically, the absorbed heat is ultimately transferred from the liquid to an outside environment, whether air or liquid-cooled.

SUMMARY OF THE INVENTION

The shortcomings of the prior art are overcome and additional advantages are provided through the provision of a liquid cooling apparatus for an electronics rack comprising at least one electronic subsystem chassis. The liquid cooling apparatus includes: a rack-level coolant manifold assembly and at least one movable chassis-level manifold subassembly. The rack-level coolant manifold assembly includes a rack-level inlet manifold and a rack-level outlet manifold, and is configured to mount to the electronics rack. The at least one movable chassis-level manifold subassembly is configured to couple to the electronics rack, adjacent to at least one electronic subsystem chassis, and pass liquid coolant to one or more components of the at least one electronic subsystem chassis for facilitating cooling of the one or more components thereof. The at least one chassis-level manifold subassembly includes a chassis-level coolant inlet manifold and a chassis-level coolant outlet manifold. The chassis-level coolant inlet manifold is coupled in fluid communication with the rack-level inlet manifold and the chassis-level coolant outlet manifold is coupled in fluid communication with the rack-level outlet manifold. The at least one movable chassis-level manifold subassembly, when coupled to the electronics rack, is slidable relative to the electronics rack to facilitate access to a removable component of the at least one electronic subsystem chassis, wherein the at least one electronic subsystem chassis includes at least one removable component.

In another aspect, a cooled electronics rack is provided. The cooled electronics rack includes an electronics system and a liquid cooling apparatus for facilitating cooling of one or more components of at least one electronics subsystem of the electronics system. The electronics system includes the at least one electronics subsystem to be cooled, an electronics rack, and at least one air-moving device. The electronics rack at least partially surrounds and supports the at least one electronics subsystem, and includes an air inlet side and an air outlet side. The air inlet and air outlet sides respectively enable ingress and egress of air through the electronics rack, including through the at least one electronics subsystem to be cooled. The at least one air-moving device causes air to flow from the air inlet side of the electronics rack, across the at least one electronics subsystem to the air outlet side of the electronics rack. The liquid cooling apparatus includes a rack-level coolant manifold assembly and at least one movable chassis-level manifold subassembly. The rack-level coolant manifold assembly, which is mounted to the electronics rack, includes a rack-level inlet manifold and a rack-level outlet manifold. The at least one movable chassis-level manifold subassembly is movably coupled to the electronics rack adjacent to the at least one electronics subsystem to be cooled to pass liquid coolant to the one or more components of the at least one electronic subsystem for facilitating cooling of the one or more components thereof. The at least one movable chassis-level manifold subassembly includes a chassis-level coolant inlet manifold and a chassis-level coolant outlet manifold. The chassis-level coolant inlet manifold is coupled in fluid communication with the rack-level inlet manifold, and the chassis-level coolant outlet manifold is coupled in fluid communication with the rack-level outlet manifold. The at least one movable chassis-level manifold subassembly is slidable relative to the electronics rack to facilitate access to a removable component of the at least one electronics subsystem, wherein each electronics subsystem of the at least one electronics subsystem includes at least one removable component.

In a further aspect, a method is provided for facilitating cooling of an electronics rack comprising at least one electronic subsystem chassis. The method includes: providing a rack-level coolant manifold assembly including a rack-level inlet manifold and a rack-level outlet manifold, the rack-level coolant manifold assembly being configured to mount to the electronics rack; providing at least one movable chassis-level manifold assembly configured to couple to the electronics rack adjacent to the at least one electronic subsystem chassis and pass liquid coolant to one or more components of the at least one electronic subsystem chassis for facilitating cooling of at least one component thereof, wherein the at least one movable chassis-level manifold subassembly includes a chassis-level coolant inlet manifold and a chassis-level coolant outlet manifold; mounting the rack-level coolant manifold assembly to the electronics rack, and coupling the at least one movable chassis-level manifold subassembly to the electronics rack adjacent to the at least one electronic subsystem chassis; and coupling in fluid communication the chassis-level coolant inlet manifold and the rack-level inlet manifold, and coupling in fluid communication the chassis-level coolant outlet manifold and the rack-level outlet manifold, wherein the at least one movable chassis-level manifold subassembly is slidably adjustable relative to the electronics rack to facilitate access to a removable component of the at least one electronic subsystem chassis, wherein the at least one electronic subsystem chassis comprises at least one removable component.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the term "electronics system", includes any housing, frame, rack, compartment, blade server system, etc., having one or more heat generating components of a computer system, and may be, for example, a stand alone computer processor having high, mid or low end processing capability. In one embodiment, an electronics system may comprise multiple electronics subsystems, each having one or more heat generating components disposed therein requiring cooling. "Electronics subsystem" refers to any blade, book, node, etc., having one or more heat generating electronic components. Electronics subsystems of an electronics system may be movable or fixed relative to the electronics system, with the blades of a blade center system being one example of subsystems of an electronics system to be cooled. In another example, the electronics system may comprise an electronics rack having one or more multi-blade center systems disposed therein, with each multi-blade center system being an example of an electronic subsystem chassis containing a plurality of electronics subsystems (e.g., removable blades) having one or more components to be cooled. As used herein, "electronic subsystem chassis" refers to any sub-housing, drawer, compartment, etc., containing one or more electronics subsystems of an electronics system, such as an electronics rack.

Reference is made below to the drawings, which are not drawn to scale and are simplified for ease of understanding, and wherein the same reference numbers used throughout different figures designate the same or similar components.

Figure 1A:
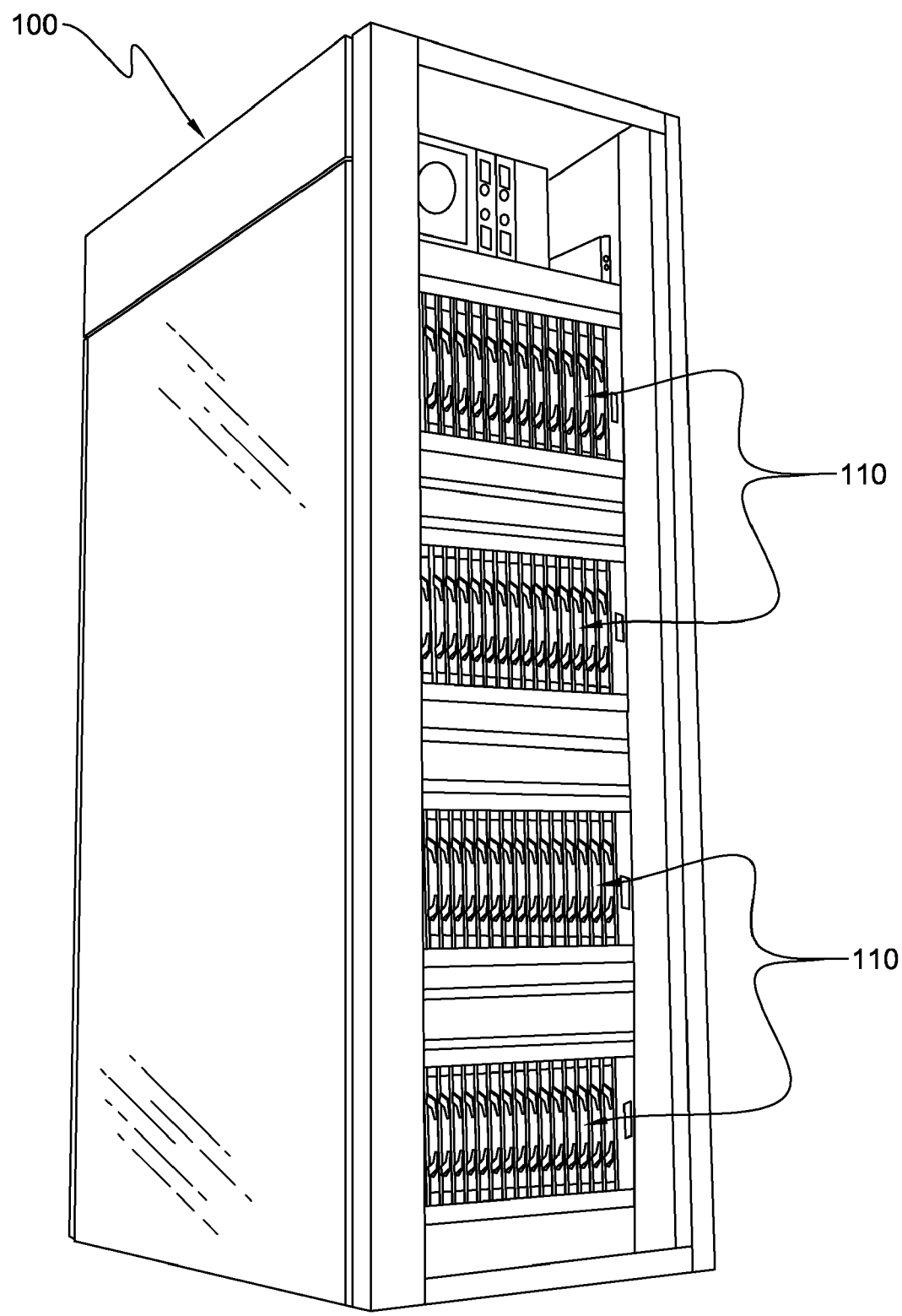
FIG. 1A depicts one embodiment of an electronics rack employing a stack of multiple-blade center systems to receive liquid coolant, in accordance with an aspect of the present invention.

FIG. 1A depicts one embodiment of an electronics rack 100 comprising a stack of multi-blade center systems 110, as well as supporting power supplies, networking equipment, etc.

Figure 1B:
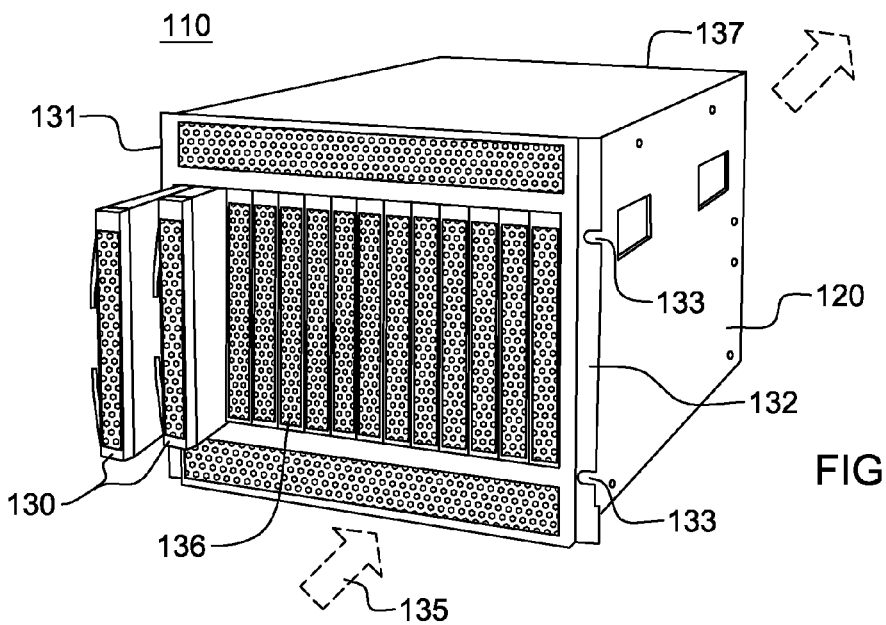
FIG. 1B is an isometric view of one embodiment of one multi-blade center system of the electronics rack of FIG. 1A.

FIG. 1B illustrates one embodiment of a multi-blade center system 110, one example of which is marketed by International Business Machines Corporation, of Armonk, N.Y. By way of specific example, multi-blade center system 110 may comprise a stand alone server system which incorporates scalable computing functionality up to, for example, fourteen high performance servers (or blades).

As shown in FIG. 1B, multi-blade center system 110 includes an electronics subsystem chassis 120 and multiple removable blades 130. As one example, each removable blade 130 is an electronics subsystem, such as a server of a multi-server electronics system. A first flange 131 and second flange 132 with openings 133 are also illustrated. Typically, flanges 131, 132 are used to secure the multi-blade center system within an electronics rack, such as depicted in FIG. 1A. Airflow 135 is through an air inlet side 136 of multi-blade center system 110 to an air outlet side 137, and is established, for example, by two or more air-moving devices (not shown) disposed at the back portion of the system housing. Electrical and networking infrastructure is also located near the back of electronics subsystem chassis 120.

Figure 1C:
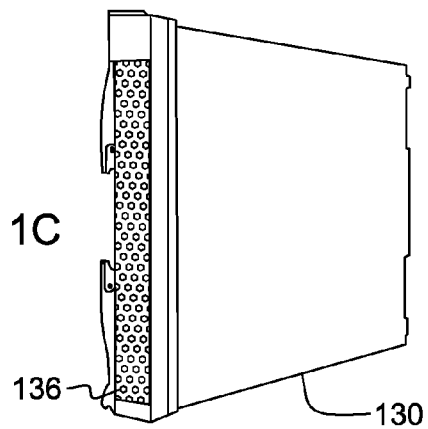
FIG. 1C is an isometric view of one embodiment of an individual removable blade of a multi-blade center system of FIG. 1B.
Figure 1D:
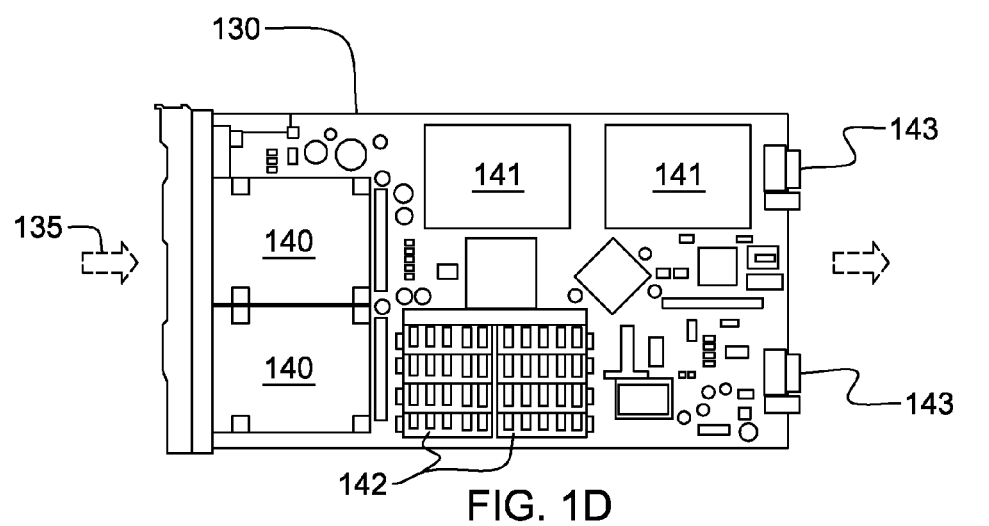
FIG. 1D is a side elevational view of one embodiment of the removable blade of FIG. 1C.

FIGS. 1C & 1D depict one embodiment of a removable blade 130 of the electronic subsystem chassis. As illustrated in FIG. 1D, removable blade 130 includes, for example, multiple processors above which conventionally reside respective air-cooled heat sinks 140. In this example, each removable blade is a complete computer system, or subsystem, and includes, for example, Direct Access Storage Device (DASD) 141 and Dual In-Line Memory Modules (DIMMs) 142. Electrical connectors 143 are provided for electrically connecting blade 130 to the respective electronic subsystem chassis 120 (FIG. 1B). Corresponding electrical connectors are disposed within the electronic subsystem chassis near the back thereof for making electrical connection to connectors 143 when the blade is inserted into the chassis in operational position.

By way of specific example, a typical blade center chassis today is 9 U tall, and houses 14 field-replaceable blades, each containing two central processing units (CPUs). A standard electronics rack that is 42 U tall can thus accommodate four such blade center chassises (each 9 U tall), for a total of 56 blades and 112 CPU modules. International Business Machines Corporation markets three versions of a blade center chassis, namely, the BC, BCH and BC-Telco versions. FIGS. 1A-1D illustrate one example of a BCH chassis marketed by International Business Machines Corporation, however, the concepts presented herein are readily applicable to any blade center chassis configuration, as well as to other electronic subsystem housing variants. Further, the liquid cooling apparatus described herein is readily adaptable to use with any housing version with a removable component configuration.

Advantageously, liquid cooling of an electronics rack such as depicted in FIG. 1A provides increased cooling at the module and rack level, and enables higher performance systems than currently feasible using air-cooling alone. Further, a liquid cooling apparatus, such as described below, improves energy efficiency by eliminating or reducing requirements of one or more data center air-conditioning units; that is, by rejecting heat to the liquid coolant, which in one example, is subsequently rejected to the ambient environment outside of the data center. With a hybrid liquid-air cooling approach such as described herein, the power consumption of the air moving devices within the electronics rack may also be reduced, further reducing acoustic noise within the data center. Additionally, a reduced form factor of the processor's thermal solution is provided, thus allowing more functionality to be packaged within a single subsystem or blade. This added functionality could be memory, hard drives, or other devices, which would allow for a more competitive offering within the market place. Also, in the blade configuration of FIG. 1D, there is a reduction in pre-heating of air flowing over the memory DIMMs by liquid cooling the processors. This pre-heating of the air is currently a significant problem, with liquid-cooling of the processors substantially alleviating the issue.

Figure 2:
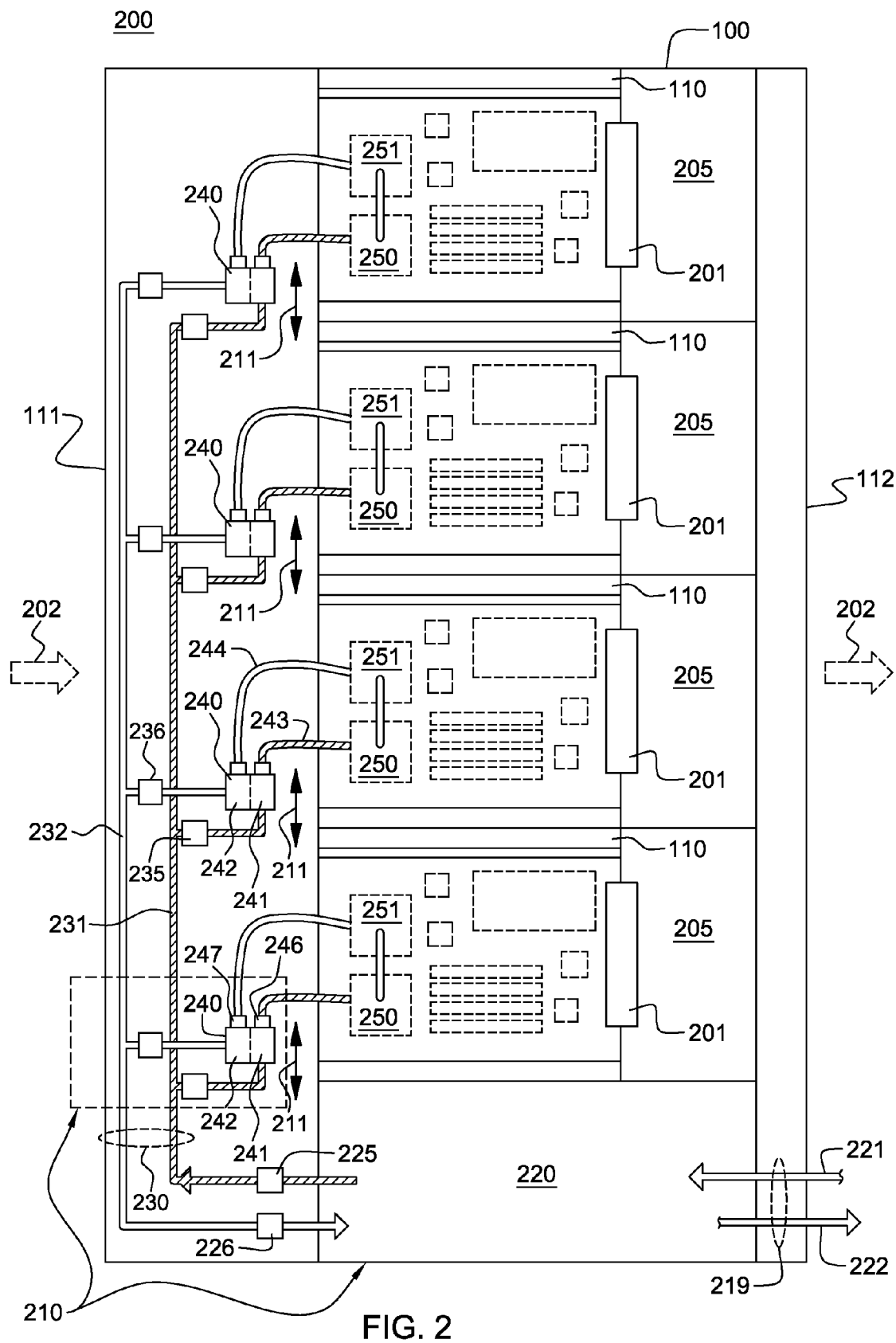
FIG. 2 is a schematic of one embodiment of a cooled electronics rack, comprising (in the illustrated embodiment) a stack of multi-blade center systems and a liquid cooling apparatus, in accordance with an aspect of the present invention.

FIG. 2 is a schematic of one embodiment of a cooled electronics rack, generally denoted 200, in accordance with an aspect of the present invention. Cooled electronics rack 200 includes an electronics rack 100 having a plurality of electronic subsystem chassises 110 stacked within the rack. In this example, four electronic subsystem chassises 110 are illustrated, with each electronic subsystem chassis being (in one example), a multi-blade center system such as depicted in FIGS. 1B-1D. As illustrated in FIG. 2, each electronic subsystem chassis includes a back plane 201, into which the respective removable blades are electrically inserted, and one or more air-moving devices 205 located near the back of each electronic subsystem chassis. These air-moving devices 205 cause air flow 202 to flow from an air inlet side 111 to an air outset side 112 of electronics rack 110 through the multiple electronic subsystem chassises 110.

One embodiment of the liquid cooling apparatus, generally denoted 210, is illustrated in FIG. 2. In this embodiment, a liquid cooling unit 220 is disposed in a lower portion of electronics rack 100. Liquid cooling unit 220 includes, for example, a liquid-to-liquid heat exchanger (not shown) for extracting heat from coolant flowing through a primary coolant loop 230 of liquid cooling apparatus 210 and dissipating the heat within a facility coolant loop 219 comprising a facility coolant supply line 221 and facility coolant return line 222. In one example, facility coolant supply line 221 and facility coolant return line 222 couple liquid cooling unit 220 to a data center facility coolant supply and return (not shown). Liquid cooling unit 220 further includes an appropriately sized reservoir, pump, and optional filter, for moving liquid coolant through primary coolant loop 230. In one embodiment, primary coolant loop 230 includes a rack-level inlet manifold 231 and a rack-level outlet manifold 232, which are coupled to liquid cooling unit 220 via, for example, flexible hoses and respective quick disconnect couplings 225, 226. The flexible hoses allow the rack-level manifolds to be mounted within, for example, a door of the electronics rack hingedly mounted to the air inlet side of the electronics rack in a manner similar to that described in co-pending, commonly assigned U.S. patent application Ser. No. 11/763,678, filed Jun. 15, 2007, entitled "Liquid-Based Cooling Apparatus for an Electronics Rack", the entirety of which is hereby incorporated herein by reference. In one example, rack-level inlet manifold 231 and rack-level outlet manifold 232 each comprise an elongate, rigid tube vertically mounted to an electronics rack 100.

In the embodiment illustrated, the rack-level coolant manifold assembly, comprising rack-level inlet manifold 231 and rack-level outlet manifold 232 is in fluid communication with multiple movable chassis-level manifold subassemblies 240. As illustrated, each movable chassis-level manifold subassembly is coupled to the electronics rack to reciprocate vertically (as indicated by arrows 211) adjacent to an associated electronic subsystem chassis 110. In the embodiment illustrated, respective quick disconnect couplings 235, 236 are employed to coupled the rack-level inlet manifold and rack-level outlet manifold to each movable chassis-level manifold subassembly 240, using for example appropriately sized, flexible rack-level tubing.

Each movable chassis-level manifold subassembly 240 includes a chassis-level coolant inlet manifold 241 and a chassis-level coolant outlet manifold 242, disposed, in this example, within a common structure, but isolated to prevent the direct flow of coolant therebetween. The chassis-level coolant inlet manifold 241 of each movable chassis-level manifold subassembly 240 is coupled via flexible tubing 243 to a first cold plate 250 of two series-coupled cold plates 250, 251 within each removable blade of an associated electronic subsystem chassis 110. Further, flexible tubing 244 couples each liquid-cooled cold plate 251 to the chassis-level coolant outlet manifold 242 of the respective movable chassis-level manifold subassembly 240. These flexible tubes 243, 244 are sized and provided with sufficient flexibility to allow the associated movable chassis-level manifold subassembly 240 to reciprocate within a designed extent of travel, as illustrated by arrows 211. Each chassis-level flexible tubing 243, 244 couples to the respective chassis-level coolant inlet manifold 241, or chassis-level coolant outlet manifold 242 via an appropriately sized quick disconnect coupling 246, 247. In one implementation example, the previously air-cooled heat sinks of the blade referenced in FIG. 1D are removed and replaced with corresponding liquid-cooled cold plates 250, 251 through with liquid coolant passes in-series, as illustrated in FIG. 2.

As noted, in one example, the rack-level inlet manifold 231 and rack-level outlet manifold 232 comprise rigid structures, while the remaining tubing coupling the rack-level inlet and outlet manifolds to liquid cooling unit 220, and to movable chassis-level manifold subassemblies 240 are flexible tubing, as is the tubing coupling movable chassis-level manifold subassembly 240 to the respective sets of series-coupled cold plates. Note that two series-coupled cold plates are illustrated and described herein by way of example only. The liquid cooling apparatus could readily be applied to use with a single liquid-cooled cold plate, or to an electronic subsystem comprising multiple liquid-cooled cold plates, either coupled in parallel or in series fluid communication with the associated movable chassis-level manifold subassembly.

Figure 3:
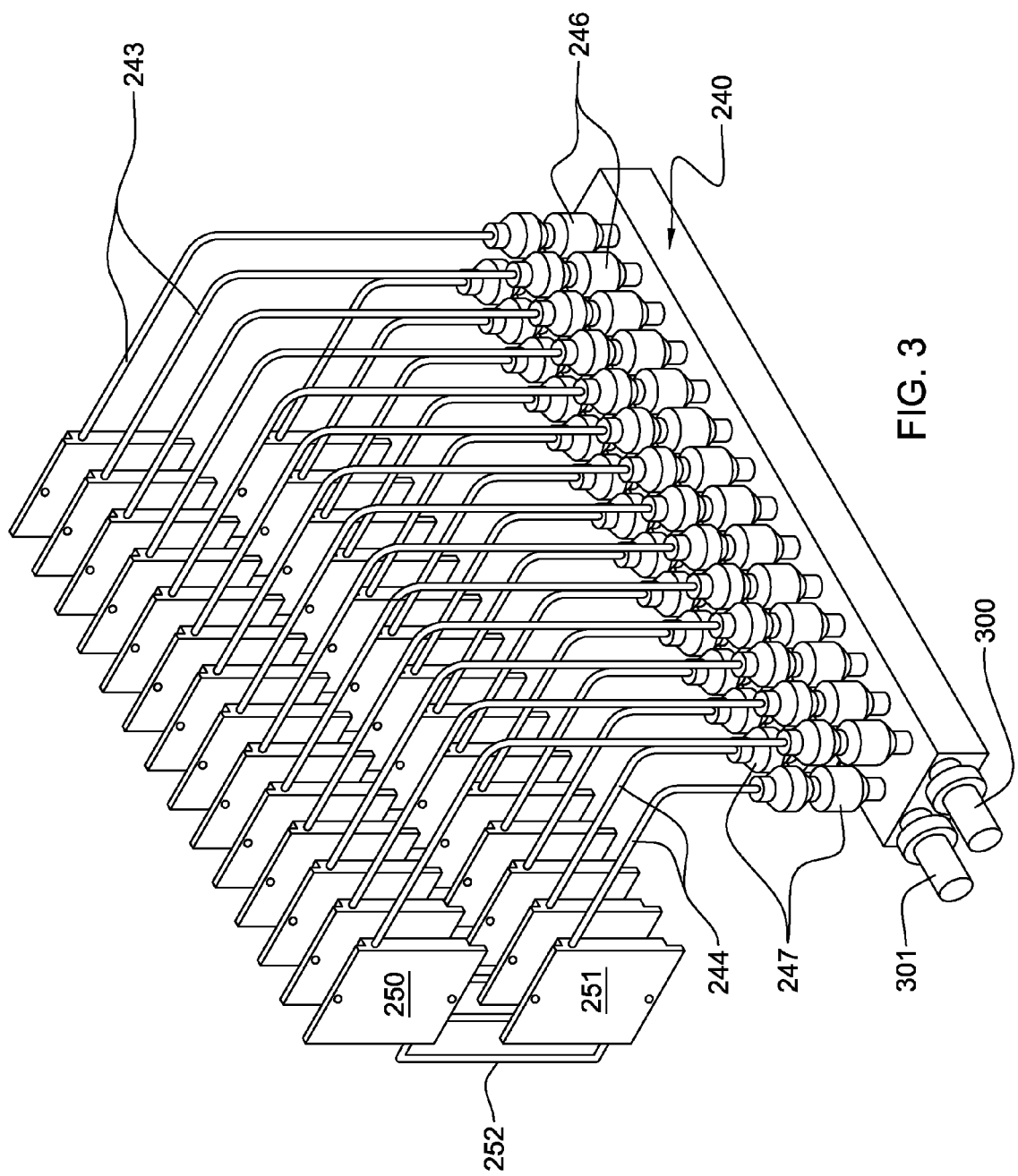
FIG. 3 is an isometric view of one embodiment of a chassis-level coolant manifold subassembly of a liquid cooling apparatus of FIG. 2, and illustrating supply and return of liquid coolant to multiple sets of series-connected cold plates (disposed within the blades of, for example, a respective multi-blade center system (such as shown in FIG. 1B)), in accordance with an aspect of the present invention.

FIG. 3 is a partial representation of one embodiment of a movable chassis-level manifold subassembly 240 shown coupled in fluid communication to multiple sets of two series-connected cold plates 250, 251, which as noted above, are assumed (in one embodiment) to be coupled to respective heat-generating components (such as microprocessors) disposed within respective blades of a multi-blade center system such as depicted in FIGS. 1B & 2.

In this embodiment, removable chassis-level manifold subassembly 240 includes two separate manifolds, that is, the chassis-level coolant inlet manifold and the chassis-level coolant outlet manifold. Inlet to the chassis-level coolant inlet manifold is via a respective hose connection 300, and outlet of coolant from the chassis-level coolant outlet manifold is via a hose connection 301, as discussed above in connection with FIG. 2. Similarly, a plurality of quick disconnect couplings 246 facilitate coupling the chassis-level coolant inlet manifold to first cold plates 250 of the respective pairs of series-connected cold plates 250, 251 (disposed within the blades of the multi-blade center system), and a plurality of quick disconnect couplings 247 facilitate coupling the chassis-level coolant outlet manifold to each second cold plate 251 of the pairs of series-connected cold plates 250, 251 for facilitating return of liquid coolant from the cold plates to the manifold. Flexible tubes or hoses 243, 244 couple movable chassis-level manifold subassembly 240 to the respective sets of cold plates. As noted, these flexible chassis-level tubes 243, 244 are of sufficient length to allow for movement of chassis-level manifold subassembly 240 as illustrated in FIGS. 4A-5B. Appropriate tubing 252 couples the first cold plate and second cold plate of each pair of series-connected cold plates in fluid communication.

Figure 4A:
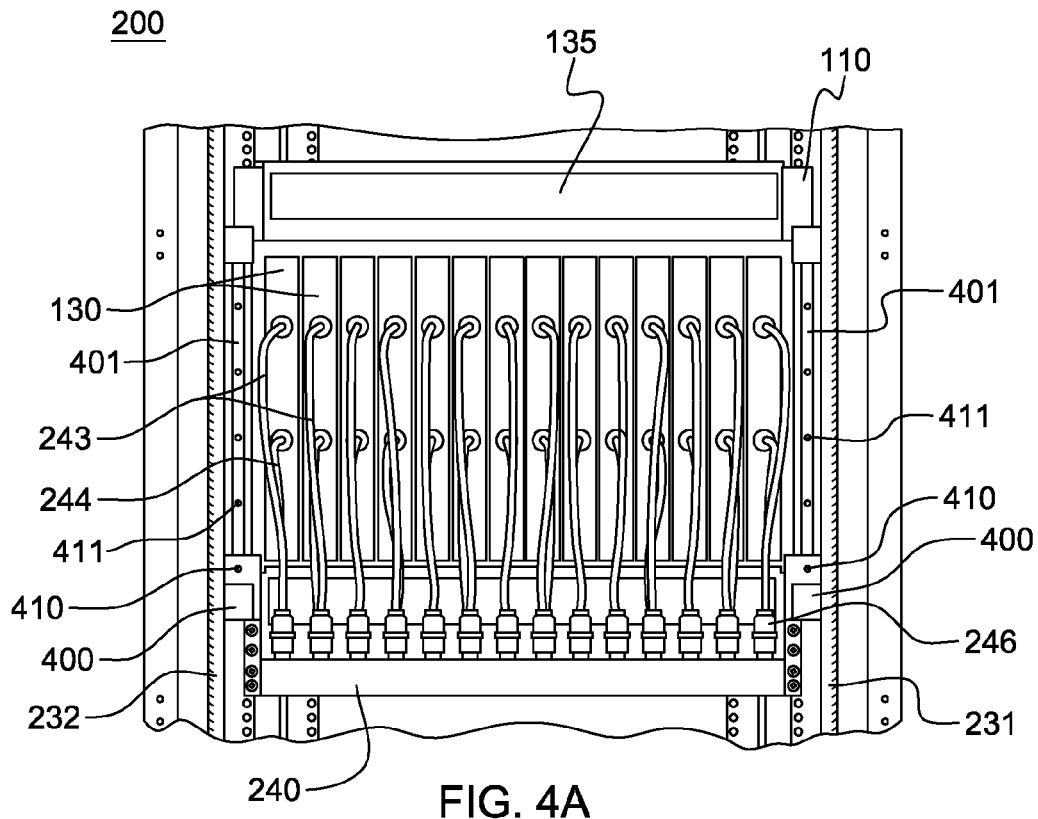
FIG. 4A is a partial elevational view of one embodiment of the cooled electronics rack of FIG. 2, and illustrating a portion of a liquid cooling apparatus (including a movable chassis-level coolant manifold subassembly), in accordance with an aspect of the present invention.
Figure 4B:
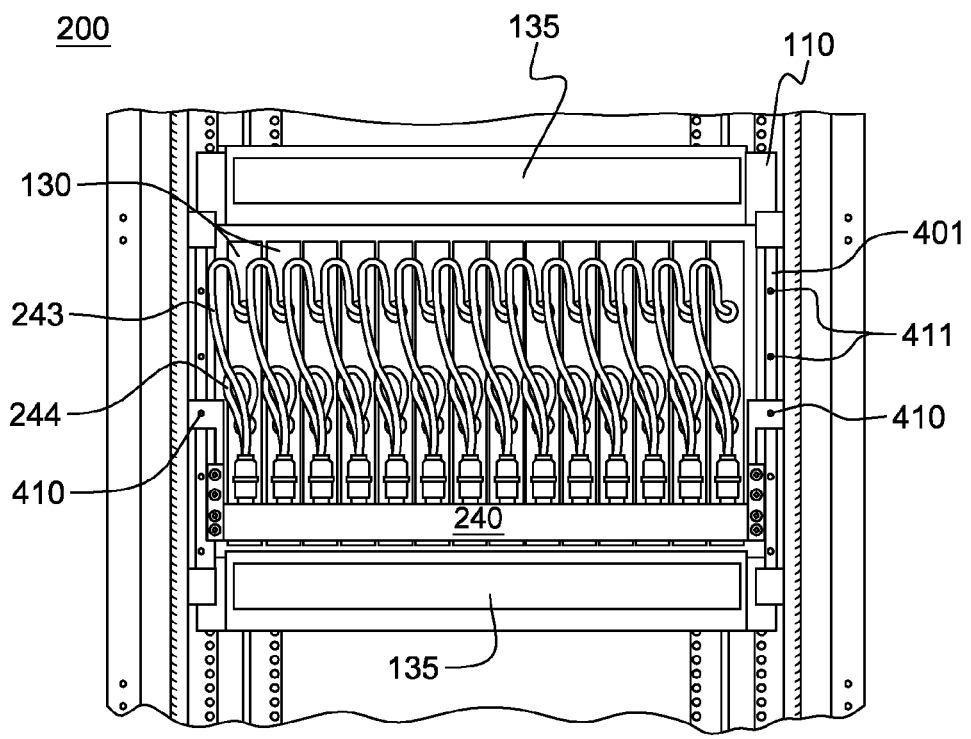
FIG. 4B is a partial elevational view of the cooled electronics rack of FIG. 4A, and illustrating the movable chassis-level coolant manifold subassembly slidably adjusted to a different position to allow access to a power supply unit of the respective multi-blade center system, in accordance with an aspect of the present invention.

FIGS. 4A & 4B illustrate a partial embodiment of a cooled electronics rack 200, in accordance with an aspect of the present invention. In this embodiment, a single electronic subsystem chassis 110 is illustrated, with the chassis including a plurality of removable, vertically-oriented blades 130, as well as multiple horizontally-oriented power supply units 135, which are also selectively removable. The liquid cooling apparatus includes a rack-level inlet manifold 231 and a rack-level outlet manifold 232, which in one embodiment are rigid structures mounted to the electronics rack. Further illustrated in FIGS. 4A & 4B is a movable chassis-level manifold subassembly 240, one embodiment of which is described above in connection with FIGS. 2 & 3. Movable chassis-level manifold subassembly 240 again couples to one or more cold plates disposed within the individual removable blades 130 of the respective electronics subsystem chassis (for example, multi-blade center system) disposed within the cooled electronics rack. The movable chassis-level manifold subassembly 240 distributes liquid coolant to the individual blades of the associated chassis to facilitate liquid cooling of one or more components of the individual blades as explained above. In the example described above in connection with FIGS. 2 & 3, two series-connected cold plates are illustrated coupled and providing liquid cooling to two processors disposed within each blade. The movable chassis-level manifold subassembly 240 couples to the individual removable blades via flexible tubing 243, 244. The plurality of quick disconnect couplings 246 are shown in this figure, with the corresponding plurality of quick disconnect couplings 247 (see FIG. 3) being disposed behind couplings 246.

In one example, movable chassis-level manifold subassembly 240 couples to the electronics rack via a chassis-level manifold support 400 mounted directly to the respective electronic subsystem chassis, for example, through openings 133 in first and second flanges 131, 132 of the electronics subsystem chassis 120 illustrated in FIG. 1B. Chassis-level manifold support 400 includes, in one embodiment, cylindrical rods 401, upon which movable chassis-level manifold subassembly 240 slidably adjusts. A spring-loaded latch mechanism, such as a push pin 410, is provided for engaging respective aligned holes 411 in rods 401 to allow for a level, fixed positioning of the movable chassis-level manifold subassembly in any one of two or more positions, with five aligned sets of holes 411 being shown.

In a first position, illustrated in FIG. 4A, the movable chassis-level manifold subassembly is positioned in a location below removable blades 130 of the multi-blade center system 110, for example, to allow servicing or removal of one or more blades of the multi-blade center system. Removal of a blade is accomplished by disconnecting the appropriate flexible tubing 243, 244 using the quick disconnects 246, 247, and sliding the blade out horizontally from the electronics rack.

In a second position, illustrated in FIG. 4B, movable chassis-level manifold subassembly 240 has been raised with respect to the associated electronic subsystem chassis 110 to allow, for example, access to the lower power supply units 135 disposed within the chassis. In this embodiment, in either position illustrated in FIG. 4A or 4B, power supply unit 135 in the upper portion of the chassis is readily accessible for servicing or removal.

Figure 5A:
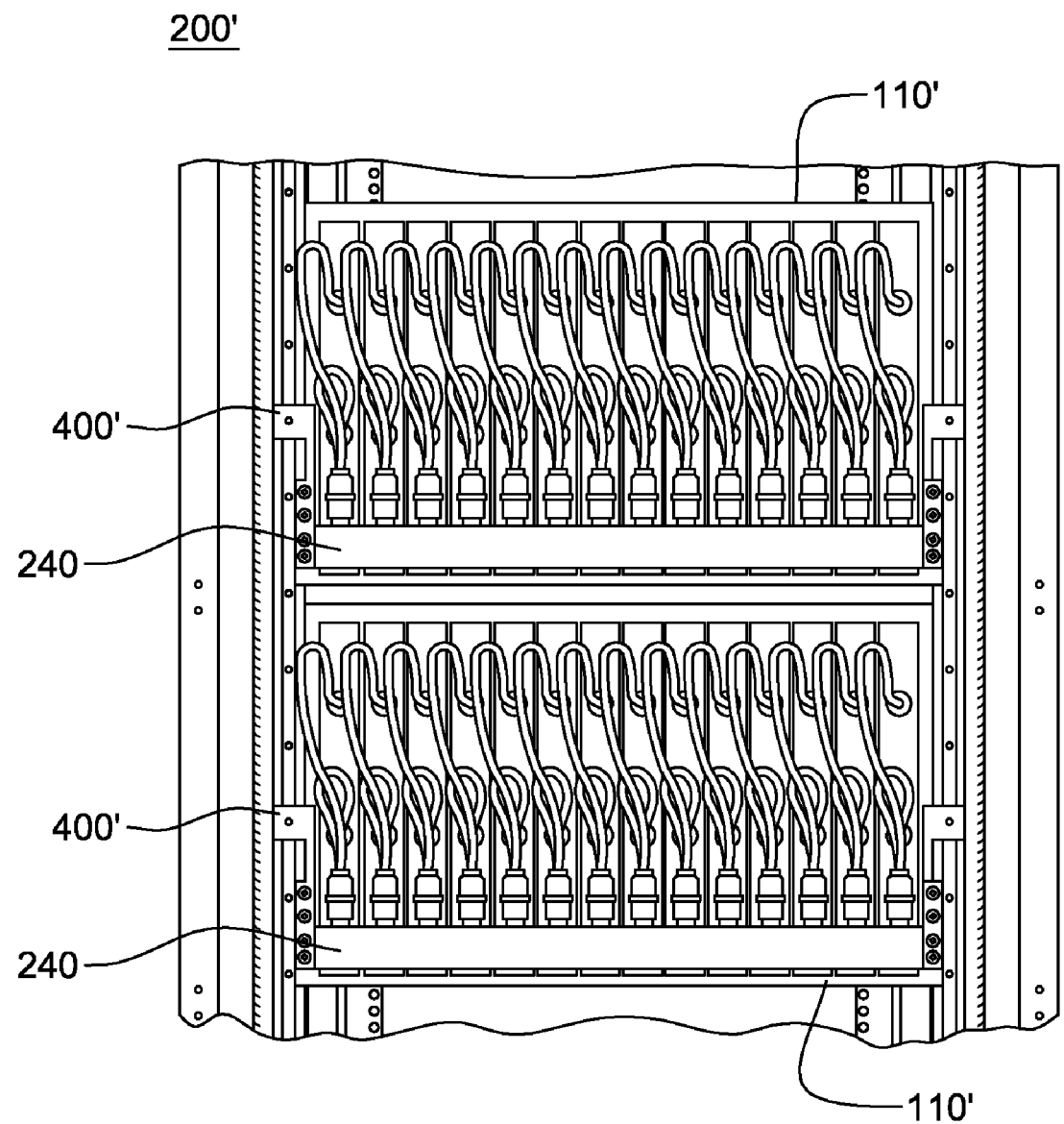
FIG. 5A is a partial elevational view of an alternate embodiment of a cooled electronics rack comprising a stack of multi-blade center systems and a liquid cooling apparatus, in accordance with an aspect of the present invention.
Figure 5B:
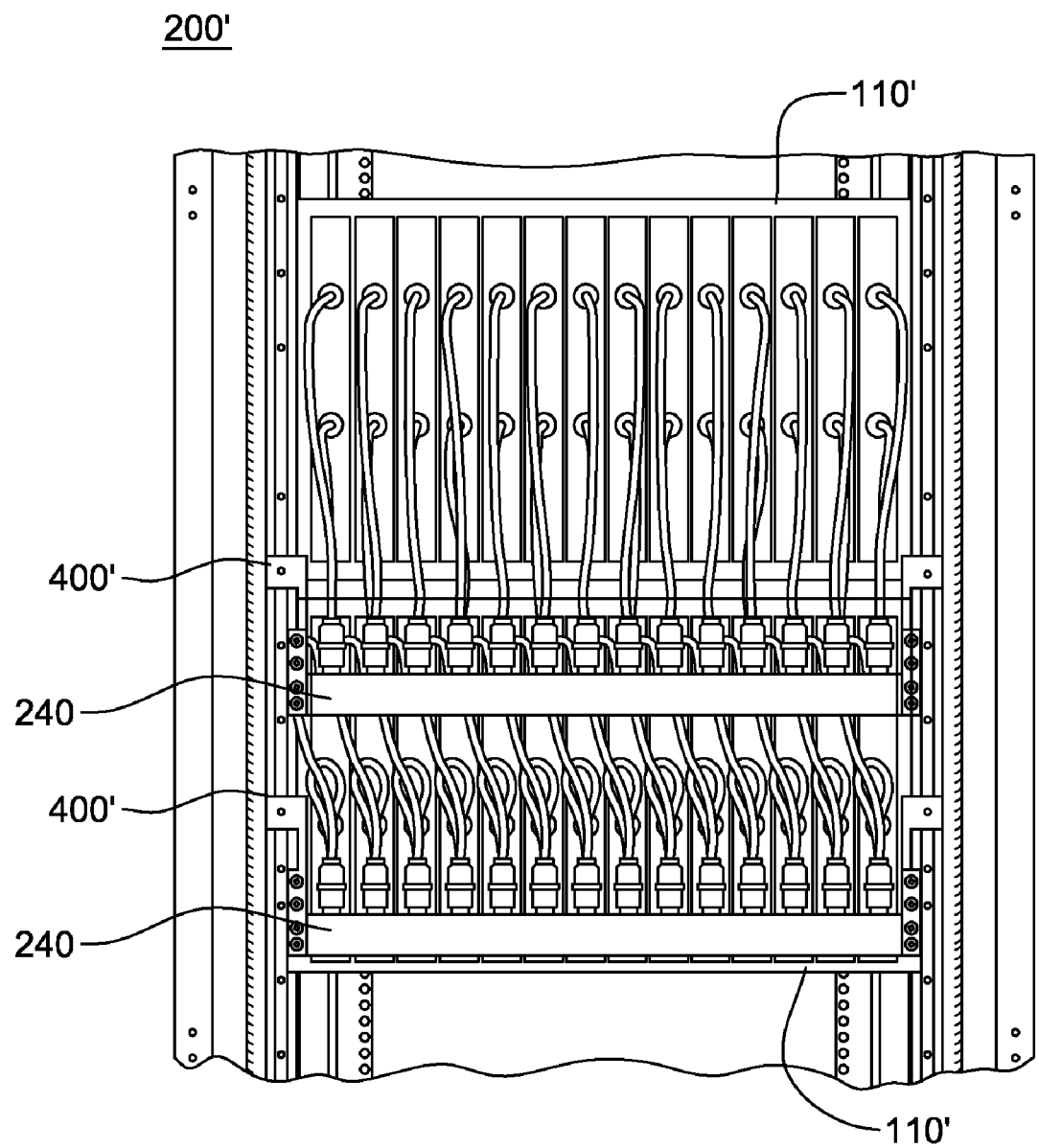
FIG. 5B is a partial elevational view of the cooled electronics rack of FIG. 5A, illustrating the movable chassis-level coolant manifold subassembly repositioned to allow access to one or more blades of the multi-blade center system, in accordance with an aspect of the present invention.

FIGS. 5A & 5B depict an alternate embodiment of a cooled electronics rack 200' employing stacked electronic subsystem chassises 110'. In this embodiment, each electronic subsystem chassis comprises (as one example) a multi-blade center system, including a plurality of vertically-oriented removable blades each, for example, housing a respective electronic subsystem with one or more processors to be liquid-cooled using the liquid cooling apparatus described herein. In this electronic subsystem chassis embodiment, the removable power supply units illustrated above in connection with FIGS. 1B, 2 & 4 are omitted. Therefore, the movable chassis-level manifold subassembly 240 and its associated chassis-level manifold support 400' are configured to allow the movable chassis-level manifold subassembly to reside in at least two positions, one of which is illustrated in FIG. 5A over the associated electronic subsystem chassis, and the other of which is illustrated in FIG. 5B, over an adjacent electronic subsystem chassis, which allows for the removal of one or more selected blades of the associated electronic subsystem chassis, as described above in connection with the embodiment of FIGS. 4A & 4B.

Figure 6A:
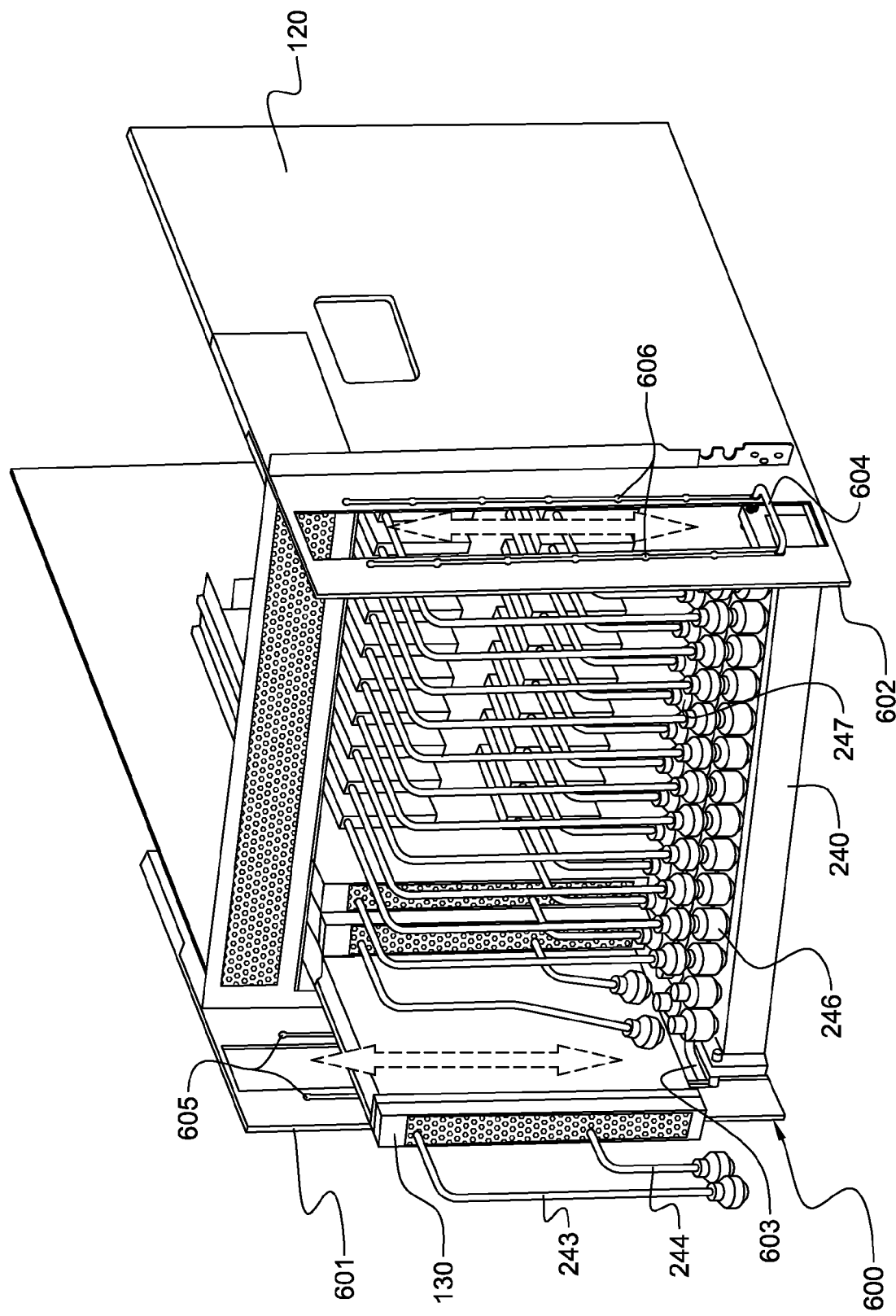
FIG. 6A illustrates an alternate embodiment of a portion of a liquid cooling apparatus, wherein the movable chassis-level coolant manifold subassembly is mounted to a partially illustrated electronic subsystem chassis, in accordance with an aspect of the present invention.
Figure 6C:
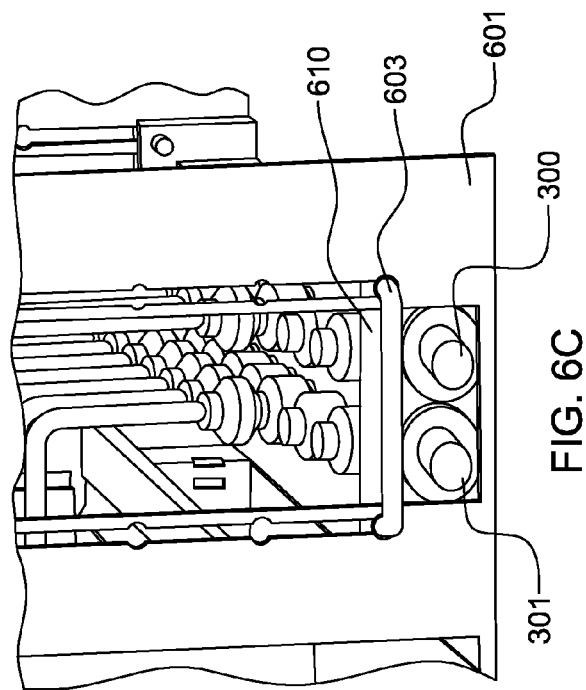
FIG. 6C is a further partially enlarged view of the liquid cooling apparatus of FIG. 6A, in accordance with an aspect of the present invention.
Figure 6B:
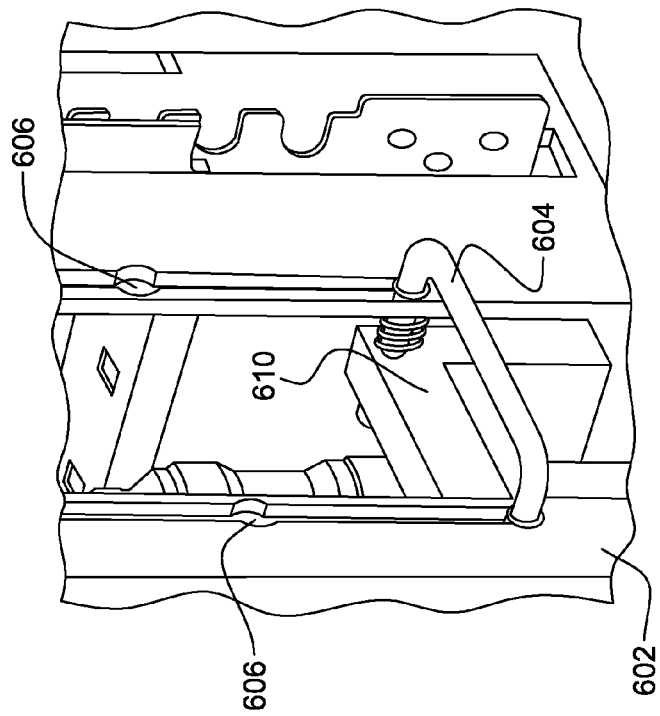
FIG. 6B is a partially enlarged view of the liquid cooling apparatus of FIG. 6A, in accordance with an aspect of the present invention.

FIGS. 6A-6C illustrate an alternate embodiment of a chassis-level manifold support, generally denoted 600, in accordance with an aspect of the present invention. In this embodiment, chassis-level manifold support 600 is sized and configured to mount to a respective electronic subsystem chassis 120, which may comprise a multi-blade center system, such as described above. As shown in FIG. 6A, the removable blades 130 of the multi-blade center system are oriented vertically within the electronic subsystem chassis 120, with only two blades being shown by way of example. The chassis-level manifold support 600 includes a left support 601 and a right support 602, each of which is mounted to a respective side of the electronic subsystem chassis. Left support 601 and right support 602 are configured to constrain movement of movable chassis-level manifold subassembly 240 to a vertical direction relative to the respective electronic subsystem chassis 120. In this embodiment, spring-loaded handles 603, 604 are mounted to the movable subassembly and provided in association with left support 601 and right support 602 to allow for the selective latching of each side of movable chassis-level manifold subassembly 240 to a selected pair of aligned pin holes 605 in left support 601, and pin holes 606 in right support 602. In operation, a technician applies force to each side handle 603, 604 to compress these springs, and adjusts the movable chassis-level manifold subassembly 240 to the desired height relative to the left support 601 and right support 602. The technician then relaxes the applied force, and the springs coupled to the handles latch the movable chassis-level manifold subassembly into the selected pin hole level 605, 606 on the left and right supports 601, 602. In this embodiment, the movable chassis-level manifold subassembly comprises a first plurality of quick disconnect couplings 246 and a second plurality of quick disconnect couplings 247, which couple flexible tubing 243, 244 to one or more components of each removable blade to be liquid-cooled, as described above. In addition, hose connections 300, 301 couple the chassis-level coolant inlet manifold and the chassis-level coolant outlet manifold to the rack-level inlet manifold and the rack-level outlet manifold, respectively (such as illustrated above in connection with FIG. 2).

As illustrated in FIGS. 6B & 6C, chassis-level manifold extensions 610 are provided at respective ends of the movable chassis-level manifold subassembly 240 to facilitate coupling the spring-biased handles 602, 603 to the movable chassis-level manifold subassembly. Alternatively, the manifold subassembly 240 could be configured at its ends to include an appropriately designed flange sized and positioned to allow for bolting of the respective spring-biased handle to the ends of the manifold subassembly.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A liquid cooling apparatus for an electronics rack comprising at least one electronic subsystem chassis, the liquid cooling apparatus comprising:
    a rack-level coolant manifold assembly comprising a rack-level inlet manifold and a rack-level outlet manifold, the rack-level coolant manifold assembly being configured to mount to the electronics rack; and
    at least one moveable chassis-level manifold subassembly configured to couple to the electronics rack adjacent to the at least one electronic subsystem chassis and pass liquid coolant to one or more components of the at least one electronic subsystem chassis for facilitating cooling of the one or more components thereof, wherein the at least one moveable chassis-level manifold subassembly comprises a chassis-level coolant inlet manifold and a chassis-level coolant outlet manifold, the chassis-level coolant inlet manifold being coupled in fluid communication with the rack-level inlet manifold, and the chassis-level coolant outlet manifold being coupled in fluid communication with the rack-level outlet manifold, wherein the at least one moveable chassis-level manifold subassembly, when coupled to the electronics rack, is slideable relative to the electronics rack to facilitate access to a removable component of the at least one electronic subsystem chassis, wherein the at least one electronic subsystem chassis comprises at least one removable component.

2. The liquid cooling apparatus of claim 1, wherein the at least one removable component of each electronic subsystem chassis of the at least one electronic subsystem chassis is removed by sliding the removable component horizontally relative to the electronics rack, and wherein the at least one moveable chassis-level manifold subassembly is constrained to reciprocate vertically with respect to the electronics rack when coupled thereto.

3. The liquid cooling apparatus of claim 1, wherein each electronic subsystem chassis of the at least one electronic subsystem chassis comprises multiple removable components, the multiple removable components of each electronic subsystem chassis being disposed non-coplanar.

4. The liquid cooling apparatus of claim 3, wherein the at least one electronic subsystem chassis comprises at least one multi-blade center system, and wherein the multiple removable components comprise multiple removable blades of the multi-blade center system, each blade of the multiple removable blades being oriented vertically within the electronics rack.

5. The liquid cooling apparatus of claim 4, wherein the multiple removable components of each multi-blade center system of the at least one multi-blade center system further comprise at least one removable power supply unit, each removable power supply unit being oriented horizontally within the electronics rack, wherein the multiple removable blades of each multi-blade center system of the at least one multi-blade center system are disposed orthogonal within the multi-blade center system to the at least one removable power supply unit thereof.

6. The liquid cooling apparatus of claim 1, wherein the electronics rack comprises multiple electronic subsystem chassises stacked within the electronics rack, and the liquid cooling apparatus further comprises multiple moveable chassis-level manifold subassemblies, each moveable chassis-level manifold subassembly being configured to movably couple to the electronics rack adjacent to a respective electronic subsystem chassis of the multiple electronic subsystem chassises, and each moveable chassis-level manifold subassembly, when coupled to the electronics rack, being slidably adjustable relative to the electronics rack in front of the respective electronic subsystem chassis to allow repositioning thereof and facilitate access to the at least one removable component thereof.

7. The liquid cooling apparatus of claim 1, further comprising at least one chassis-level manifold support coupled to the electronics rack, and wherein the at least one movable chassis-level manifold subassembly is configured to mount to the electronics rack via the at least one chassis-level manifold support, and to reciprocate relative to the electronics rack as constrained by the at least one chassis-level manifold support, and wherein the liquid cooling apparatus further comprises at least one latching mechanism, each latching mechanism being associated with a respective movable chassis-level manifold subassembly of the at least one movable chassis-level subassembly for facilitating latching of the respective movable chassis-level manifold subassembly relative to its chassis-level manifold support, each latching mechanism having at least two latching positions relative to its chassis-level manifold support for selectively securing the movable chassis-level manifold subassembly in one of at least two positions relative to the chassis-level manifold support.

8. The liquid cooling apparatus of claim 1, further comprising flexible rack-level tubing coupling the rack-level coolant manifold assembly and the at least one movable chassis-level manifold subassembly in fluid communication, wherein the flexible rack-level tubing couples to the at least one movable chassis-level manifold subassembly through respective quick disconnect couplings disposed between the rack-level inlet manifold and the chassis-level coolant inlet manifold of each movable chassis-level manifold subassembly of the at least one movable chassis-level manifold subassembly and between the rack-level outlet manifold and the chassis-level coolant outlet manifold of each movable chassis-level manifold subassembly of the at least one movable chassis-level manifold subassembly.

9. The liquid cooling apparatus of claim 8, further comprising flexible chassis-level tubing coupling each movable chassis-level manifold subassembly of the at least one movable chassis-level manifold subassembly to the one or more components of a respective electronics subsystem chassis of the at least one electronic subsystem chassis, and wherein the chassis-level coolant inlet manifold comprises a plurality of coolant supply ports and the chassis-level coolant outlet manifold comprises a plurality of coolant return ports, the flexible chassis-level tubing coupling each movable chassis-level manifold subassembly to the one or more components of the respective electronic subsystem chassis of the at least one electronic subsystem chassis through the plurality of coolant supply ports and the plurality of coolant return ports, thereby facilitating passage of liquid coolant to the one or more components of the respective electronic subsystem chassis for cooling the one or more components thereof.

10. A cooled electronics rack comprising:
an electronics system, the electronics system comprising:
at least one electronics subsystem to be cooled;
an electronics rack at least partially surrounding and supporting the at least one electronics subsystem, the electronics rack comprising an air inlet side and an air outlet side, the air inlet and air outlet sides respectively enabling ingress and egress of air through the electronics rack, including the at least one electronics subsystem to be cooled;
at least one air-moving device, the at least one air-moving device causing air to flow from the air inlet side of the electronics rack, across the at least one electronics subsystem to the air outlet side of the electronics rack; and
a liquid cooling apparatus for facilitating cooling of one or more components of the at least one electronics subsystem, the liquid cooling apparatus comprising:
a rack-level coolant manifold assembly mounted to the electronics rack, the rack-level coolant manifold assembly comprising a rack-level inlet manifold and a rack-level outlet manifold; and
at least one movable chassis-level manifold subassembly movably coupled to the electronics rack adjacent to the at least one electronics subsystem to pass liquid coolant to one or more components of the at least one electronics subsystem for facilitating cooling of the one or more components thereof, wherein the at least one movable chassis-level manifold subassembly comprises a chassis-level coolant inlet manifold and a chassis-level coolant outlet manifold, the chassis-level coolant inlet manifold being coupled in fluid communication with the rack-level inlet manifold, and the chassis-level coolant outlet manifold being coupled in fluid communication with the rack-level coolant outlet manifold, wherein the at least one movable chassis-level manifold subassembly is slidable relative to the electronics rack to facilitate access to a removable component of the at least one electronics subsystem, wherein each electronics subsystem of the at least one electronics subsystem comprises at least one removable component.

11. The cooled electronics rack of claim 10, wherein the at least one electronics subsystem to be cooled comprises at least one multi-blade center system, each multi-blade center system comprising multiple removable blades, each blade of the multiple removable blades being oriented vertically within the electronics rack, wherein each removable blade is removed by sliding the removable blade horizontally relative to the electronics rack, and wherein the at least one removable chassis-level manifold subassembly is constrained to reciprocate vertically with respect to the electronics rack.

12. The cooled electronics rack of claim 11, wherein the electronics system comprises multiple multi-blade center systems disposed within the electronics rack, and the liquid cooling apparatus comprises multiple movable chassis-level manifold subassemblies, each movable chassis-level manifold subassembly being movably coupled to the electronics rack adjacent to a respective multi-blade center system of the multiple multi-blade center systems, and each movable chassis-level manifold subassembly being slidably adjustable relative to the electronics rack in front of its respective multi-blade center system to allow repositioning thereof and facilitate access to the multiple removable blades of the respective multi-blade center system.

13. The cooled electronics rack of claim 12, wherein each multi-blade center system further comprises at least one removable power supply unit, each removable power supply unit being oriented horizontally within the electronics rack, and wherein the multiple removable blades of each multi-blade center system are non-coplanar and disposed orthogonal to the at least one removable power supply thereof.

14. The cooled electronics rack of claim 10, wherein the liquid cooling apparatus further comprises at least one chassis-level manifold support coupled to the electronics rack, the at least one movable chassis-level manifold subassembly being coupled to the electronics rack via the at least one chassis-level manifold support, and reciprocating relative to the electronics rack as constrained by the at least one chassis-level manifold support, and wherein the liquid coolant apparatus further comprises at least one latching mechanism, each latching mechanism being associated with a respective movable chassis-level manifold subassembly of the at least one movable chassis-level subassembly for facilitating latching of the respective movable chassis-level manifold subassembly relative to its chassis-level manifold support, each latching mechanism having at least two latching positions relative to its chassis-level manifold support for selectively securing the movable chassis-level manifold subassembly in one of at least two positions relative to the chassis-level manifold support.

15. The cooled electronics rack of claim 10, further comprising flexible rack-level tubing coupling the rack-level coolant manifold assembly and the at least one movable chassis-level manifold subassembly in fluid communication, wherein the flexible rack-level tubing couples to the at least one movable chassis-level manifold subassembly through respective quick disconnect couplings dispose between the rack-level inlet manifold and the chassis-level coolant inlet manifold of each movable chassis-level manifold subassembly of the at least one movable chassis-level manifold subassembly and between the rack-level outlet manifold and the chassis-level coolant outlet manifold of each movable chassis-level manifold subassembly of the at least one movable chassis-level manifold subassembly, and wherein the liquid cooling apparatus further comprises flexible chassis-level tubing coupling each movable chassis-level manifold subassembly of the at least one movable chassis-level manifold subassembly to the one or more components of a respective electronics subsystem to be cooled of the at least one electronics subsystem to be cooled, and wherein the chassis-level coolant inlet manifold comprises a plurality of coolant supply ports and the chassis-level coolant outlet manifold comprises a plurality of coolant return ports and wherein a plurality of quick disconnect couplings are associated with the plurality of coolant supply ports and with the plurality of coolant return ports of the chassis-level coolant inlet manifold and the chassis-level coolant outlet manifold, respectively, of each movable chassis-level manifold subassembly for facilitating removal of the at least one removable component of the respective electronics subsystem.

16. A method of facilitating cooling of an electronics rack, the electronics rack comprising at least one electronic subsystem chassis, the method comprising:

providing a rack-level coolant manifold assembly comprising a rack-level inlet manifold and a rack-level outlet manifold, the rack-level coolant manifold assembly being configured to mount to the electronics rack;

providing at least one movable chassis-level manifold subassembly configured to couple to the electronics rack adjacent to the at least one electronic subsystem chassis and provide liquid coolant to one or more components of the at least one electronic subsystem chassis for facilitating cooling of the one or more components thereof, wherein the at least one movable chassis-level manifold subassembly comprises a chassis-level coolant inlet manifold and a chassis-level coolant outlet manifold;

mounting the rack-level coolant manifold assembly to the electronics rack, and coupling the at least one movable chassis-level manifold subassembly to the electronics rack adjacent to the at least one electronic subsystem chassis; and coupling in fluid communication the chassis-level coolant inlet manifold and the rack-level inlet manifold, and coupling in fluid communication the chassis-level coolant outlet manifold and the rack-level outlet manifold, wherein the at least one movable chassis-level manifold subassembly is slidably adjustable relative to the electronics rack to facilitate access to a removable component of the at least one electronic subsystem chassis, wherein the at least one electronic subsystem chassis comprises at least one removable component.

17. The method of claim 1, wherein coupling the movable chassis-level manifold subassembly to the electronics rack further comprises constraining the at least one movable chassis-level manifold subassembly to reciprocate vertically with respect to the electronics rack when coupled thereto, and wherein the at least one removable component of each electronic subsystem chassis of the least one electronic subsystem chassis is removed by sliding the removable component horizontally relative to the electronics rack.

18. The method of claim 16, wherein the coupling of the at least one movable chassis-level manifold subassembly to the electronics rack further comprises mounting a chassis-level manifold support to the electronics rack, and coupling the at least one movable chassis-level manifold subassembly to the at least one chassis-level manifold support, the at least one chassis-level manifold support allowing the at least one movable chassis-level manifold subassembly to slidably adjust relative to electronics rack as constrained by the at least one chassis-level manifold support.

19. The method of claim 18, further comprising providing at least one latching mechanism in association with the at least one movable chassis-level manifold sub assembly, each latching mechanism being associated with a respective movable chassis-level manifold subassembly of the at least one chassis-level subassembly for facilitating latching of the respective movable chassis-level manifold subassembly relative to its chassis-level manifold support, each latching mechanism having at least two latching positions relative to its chassis-level manifold support for selectively securing the movable chassis-level manifold subassembly in one of at least two positions relative to the chassis-level manifold support.

20. The method of claim 19, wherein the coupling in fluid communication further comprises providing flexible rack-level tubing coupling the rack-level coolant manifold assembly and the at least one movable chassis-level manifold subassembly in fluid communication, wherein the flexible rack-level tubing couples to the at least one movable chassis-level manifold subassembly through respective quick disconnect couplings disposed between the rack-level inlet manifold and the chassis-level coolant inlet manifold of each movable chassis-level manifold subassembly of the at least one movable chassis-level manifold subassembly, and between the rack-level outlet manifold and the chassis-level coolant outlet manifold of each movable chassis-level manifold subassembly of the at least one movable chassis-level manifold subassembly, and wherein the coupling in fluid communication comprises providing flexible chassis-level tubing coupling each movable chassis-level manifold subassembly of the at least one movable chassis-level manifold subassembly to the one or more components of a respective electronic subsystem chassis, and wherein the chassis-level coolant manifold comprises a plurality of coolant supply ports and the chassis-level outlet manifold comprises a plurality of coolant return ports, and wherein a plurality of quick disconnect couplings are associated with the plurality of coolant supply ports and with the plurality of coolant return ports of the chassis-level coolant inlet manifold and the chassis-level coolant outlet manifold, respectively, for each movable chassis-level manifold subassembly for facilitating disconnect of associated flexible chassis-level tubing and removal of the at least one removable component of the respective electronic subsystem chassis.

* * * * *